United States Patent [19]

Zou et al.

[11] Patent Number: 5,280,248

[45] Date of Patent: Jan. 18, 1994

[54] BIPLANAR RF COIL FOR MAGNETIC RESONANCE IMAGING SYSTEMS

[75] Inventors: Xueming Zou, Willoughby; John L. Patrick, Chagrin Falls; Nicholas J. Mastandrea, Bedford Hts., all of Ohio

[73] Assignee: Picker International, Inc., Highland Hts., Ohio

[21] Appl. No.: 919,215

[22] Filed: Jul. 24, 1992

[51] Int. Cl.$^5$ ............................................... G01V 3/00
[52] U.S. Cl. ............................... 324/318; 128/653.5
[58] Field of Search ............... 324/300, 307, 309, 318, 324/322; 128/653.5

[56] References Cited

U.S. PATENT DOCUMENTS

| | | | |
|---|---|---|---|
| 4,642,569 | 2/1987 | Hayes et al. | 324/318 |
| 4,680,548 | 7/1987 | Edelstein et al. | 324/318 |
| 4,692,705 | 9/1987 | Hayes | 324/318 |
| 4,712,067 | 12/1987 | Roschmann et al. | 324/322 |
| 4,752,738 | 6/1988 | Patrick et al. | 128/653.5 |
| 4,820,985 | 4/1989 | Eash | 324/318 |
| 4,879,515 | 11/1989 | Roemer et al. | 324/318 |
| 5,036,282 | 7/1991 | Morich et al. | 324/318 |
| 5,057,777 | 10/1991 | Kurczewski | 324/318 |

OTHER PUBLICATIONS

"Radio Frequency Coils", Hayes, et al., pp. 142–165 (1985) NMR in Medicine: The Instrumentation and Clinical Applications.

*Primary Examiner*—Louis Arana
*Attorney, Agent, or Firm*—Fay, Sharpe, Beall, Fagan, Minnich & McKee

[57] ABSTRACT

A superconducting magnet (10) generates a uniform, static magnetic field through a central bore (12) along its longitudinal or z-axis. A biplanar gradient coil assembly (44) is inserted into the bore to create gradients across the static magnetic field along orthogonal x, y, and z-axes. A biplanar radio frequency coil assembly (50, 80) is inserted into the bore for transmitting radio frequency signals into a subject and receiving magnetic resonance signals from the subject. The radio frequency coil includes a first biplanar coil assembly (50) for generating RF signals in an x-direction and a second biplanar coil assembly (80) for generating RF signals in a y-direction. The two biplanar coil assemblies each include a plurality of conductors (52, 82) along a first plane and a second plurality of conductors (54, 84) along a parallel second plane. The conductors extend parallel to the z-direction. Capacitors (56, 58, 94) are connected in series with each of the conductors in order to control the current flow such that the current flow in each plane is uniform across the plane. The ends of the electrical conductors are connected together (66, 88) such that the current flows are equal and opposite in the two planes. A radio frequency transmitter (136) transmits RF signals to the quadrature biplanar coil assembly. A digital receiver (140) receives and demodulates radio frequency signals from the quadrature coil assembly. The demodulated signals are reconstructed (144) into an image representation for display on a video monitor (146).

16 Claims, 3 Drawing Sheets

BIPLANAR RF COIL FOR MAGNETIC RESONANCE IMAGING SYSTEMS

BACKGROUND OF THE INVENTION

The present invention relates to the magnetic resonance arts. It finds particular application in conjunction with medical magnetic resonance imaging systems and will be described with particular reference thereto. It is to be appreciated, however, that the invention will also find application in conjunction with other types of magnetic resonance imaging systems, magnetic resonance spectroscopy systems, and the like.

In magnetic resonance imaging, a strong uniform static magnetic field $B_0$ is generated, often by a superconducting magnet. This static magnetic field $B_0$ polarizes the nuclear spin system of an object to be imaged. Superconducting magnets are commonly wound on a cylindrical body former mounted in an annular helium vessel surrounded by an annular vacuum vessel for thermal isolation. The superconducting magnet generates the static magnetic field, $B_0$ along its own longitudinal axis and the common longitudinal axis of the cylindrical bore of the vacuum vessel, commonly denoted as the "z-axis".

To generate a magnetic resonance signal, the polarized spin system is first excited by a radio frequency magnetic field perpendicular to the z-axis. This RF field, denoted $B_1$, is produced by an RF coil located inside the bore of the magnet and closely conforming thereto to maximize the space available to receive a patient. The RF magnetic field, which is changing in time in a sinusoidal waveform, is turned on and off to create short RF pulses to excite magnetization in the polarized object in the bore. More specifically, the RF pulses tip the magnetization out of alignment with the z-axis and cause its macroscopic magnetic moment vector to precess around the z-axis. The precessing magnetic moment, in turn, generates a radio frequency magnetic resonance signal that is received by the RF coil in a reception mode.

To encode a sample spatially, magnetic field gradient pulses are applied after the RF excitation. The gradient magnetic fields are also applied in pulses to generate magnetic fields pointing in the z-axis, but changing in magnitude linearly in x, y, or z-directions. These gradient pulses are commonly denoted as $G_x$, $G_y$, and $G_z$ pulses, respectively. The gradient magnetic fields are generated by gradient magnetic field coils which are also located inside the magnet bore. Commonly, the gradient field coils are mounted on a cylindrical former between the RF coil and the bore. The RF and gradient field coils have a sufficient inner diameter to receive the entire body of a patient within their circular bore.

These cylindrical whole body RF and gradient coils are routinely used to examine the patient's chest cavity and to examine individual organs therein, such as the heart. Examining individual organs or small regions of the chest cavity places the RF coils a significant distance from the region of interest.

The most common whole body RF coils are saddle coils and birdcage coils. Both saddle and birdcage coils include electrical conductors which are mounted on a cylindrical dielectric former. Prior patents have also suggested mounting the RF coils on an elliptical former to follow the contour of a patient's body more accurately. Typical saddle and birdcage coils are described in "Radio Frequency Coils" by Hayes, Edelstein, and Schenck, NMR in Medicine: The Instrumentation and Clinical Applications, pages 142-165, (1985). Typical saddle coils includes four conductors extending in the z-direction, adjacent pairs of which are connected at their ends by connectors extending along the cylindrical former. In a birdcage coil, a plurality of conductors, e.g. eight, are spaced equidistant along the circular former and interconnected at their ends by a generally annular conductor extending along the surface of the circular former. For quadrature detection, a second coil rotated 90° from the first is provided.

In order to accommodate the entire body of a patient, conventional birdcage and saddle coils are relatively large in diameter and length, e.g. 60 cm in diameter and about the same length. One of the problems with whole body birdcage and saddle coils is that the large size causes a loss of signal to noise ratio. The signal to noise ratio is generally proportional to coil sensitivity and to the coil filling factor. The coil sensitivity is generally inversely proportional to a power of the coil radius. Thus, the larger the diameter of the coil, the poorer its sensitivity and the lower its signal to noise ratio. The filling factor is the ratio of the magnetic energy stored in the region of interest in the patient and the total energy generated by the RF coil. When viewing only a small region of the patient, such as the heart, the magnetic energy stored in the heart region is relatively small compared to the total energy generated by the RF coil. Hence, the filling factor is low and the signal to noise ratio is also low.

In order to improve the signal to noise ratio, when examining individual organs, the whole body RF coil is often used only as a transmitter coil. A separate receiver coil is positioned on the surface of the patient to detect the MR signals. The dedicated receiver coils are each designed for a specific organ and are sized and shaped accordingly. This increases its sensitivity to the organ and suppresses noise from other tissue in the patient. Thus, a large inventory of coils is required to image various internal organs of the body. Moreover, the sensitivity of surface coils falls off sharply away from the plane of the coil. This drop off in sensitivity toward the deeper regions of the subject causes non-uniformity in the images. Moreover, the sensitivity may drop off sufficiently fast that the examination of some deeper organs is impractical.

The present invention provides a new and improved RF coil which overcomes the above-referenced problems and others.

SUMMARY OF THE INVENTION

In accordance with the present invention, a magnetic resonance imaging system is provided in which the RF coil extends along a pair of parallel planes.

In accordance with a more limited aspect of the invention, the parallel planes are spaced sufficiently to receive the chest cavity of a patient therebetween.

In accordance with another aspect of the present invention, a second pair of planar RF coils are provided 90° offset from the first, such that the two pairs of planar RF coils are 90° out of phase for quadrature detection.

In accordance with another more limited aspect of the present invention, the planar RF coils are mounted in association with planar gradient coils, which planar RF and gradient coil assembly is selectively insertable into the bore of a magnetic resonance imager designed with conventional circular or circularly cylindrical RF and gradient coils.

One advantage of the present invention resides in its improved signal to noise ratio, filling factor, and RF coil efficiency.

Another advantage of the present invention is that it facilitates high speed, fast scan imaging techniques. It is particularly suited for freeze frame images of the heart.

Another advantage of the present invention is that it is insertable within the bore of a conventional magnetic resonance imaging apparatus without disturbing the more conventional circularly cylindrical RF and gradient coil assemblies.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
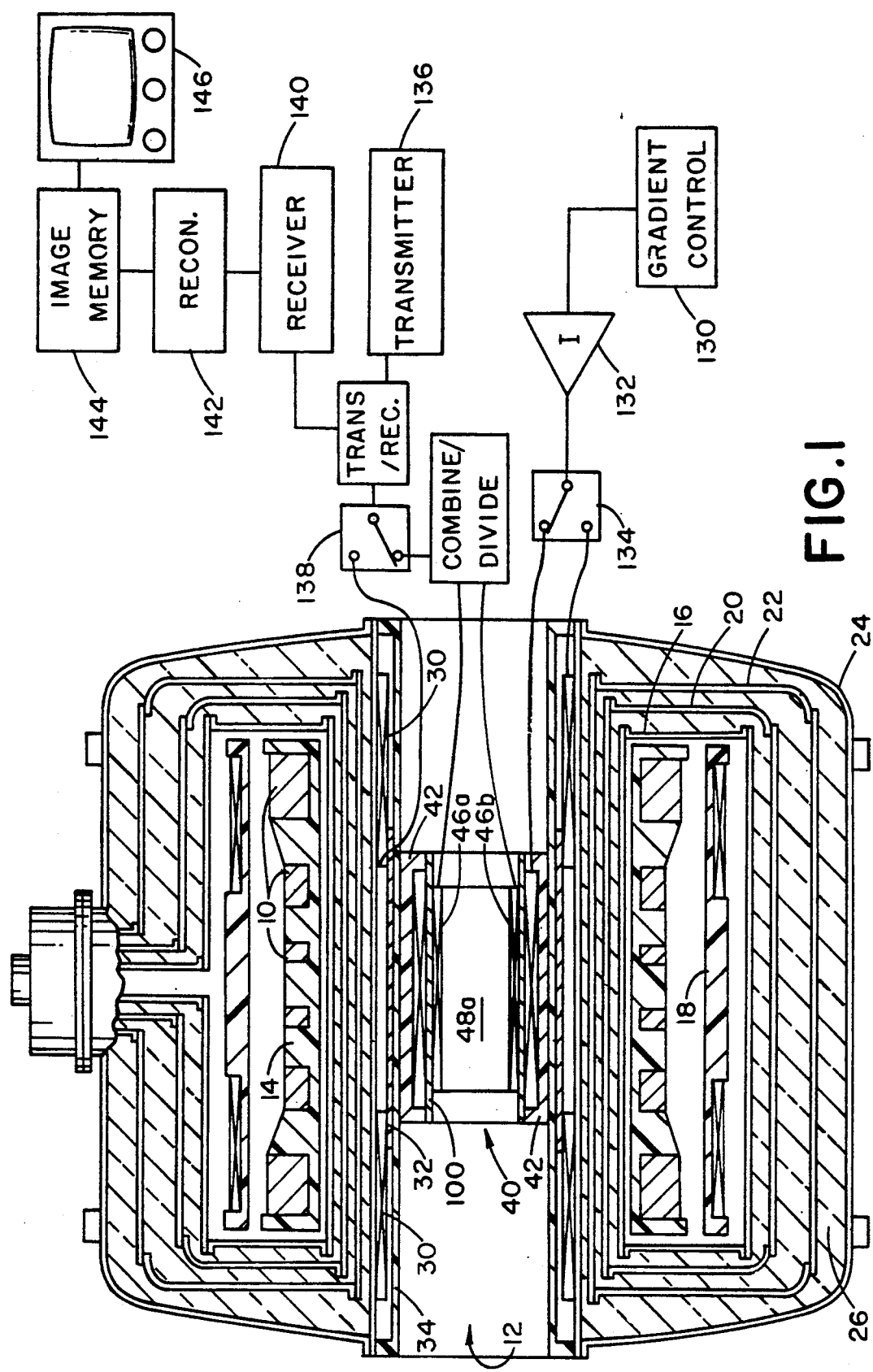
FIG. 1 is a vertical cross-sectional view of a superconducting magnetic resonance imaging apparatus with a biplanar RF coil in accordance with the present invention.

With reference to FIG. 1, a plurality of superconducting main magnetic field coils 10 generate a generally uniform static magnetic field along a longitudinal or z-axis of a central bore 12. The superconducting coils are mounted on a dielectric former 14 and received in an annular, helium vessel 16. The helium vessel is filled with liquid helium to maintain the superconducting magnets at their superconducting temperature. A main magnetic field shield coil assembly 18 generates a magnetic field which opposes the fields generated by the main magnets 10 in regions surrounding the superconducting magnets 10.

The annular helium reservoir 16 is surrounded by a first cold shield 20 which is maintained at about 20° K. or less. A second cold shield assembly 22 is chilled to about 60°-70° K. or less. An outer vacuum vessel 24 encases the cold shields to define a vacuum reservoir therearound. Layers of mylar insulation 26 are arranged between the vacuum vessel, the cold shields, and the helium reservoir.

A circularly cylindrical, whole body gradient coil assembly 30 is mounted on a circularly cylindrical dielectric former and mounted within the bore 12. A circularly cylindrical, whole body RF coil 32 is mounted on a circularly cylindrical dielectric former and mounted within the bore 12. A circularly cylindrical dielectric cosmetic sleeve 34 shields the RF and gradient coils from view and protects them from damage.

Figure 2:
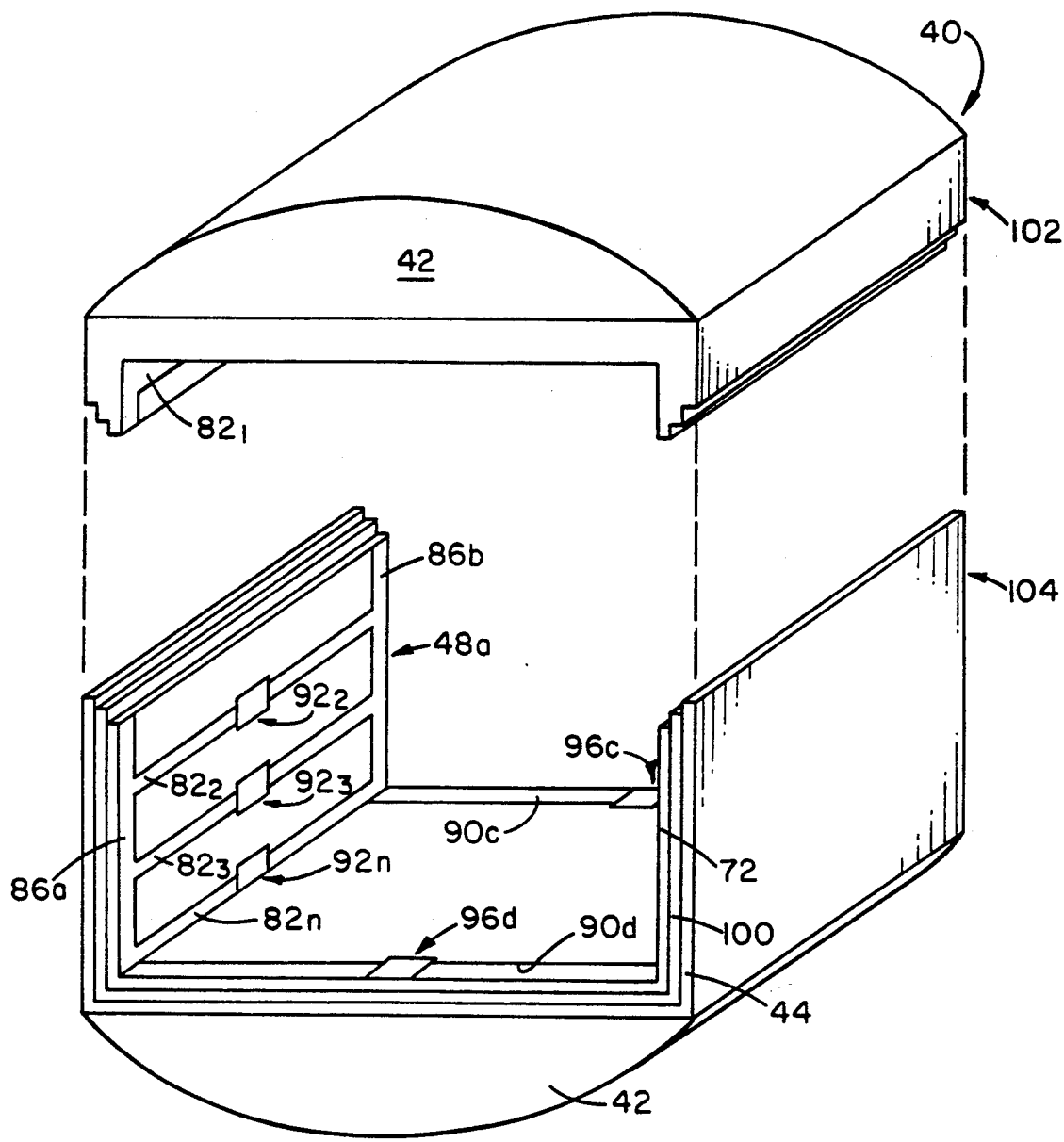
FIG. 2 is a perspective view of a biplanar RF and gradient coil assembly for insertion into a circular bore of a conventional MR imaging apparatus with a top panel lifted to facilitate receipt of a patient into the assembly.

With continuing reference to FIG. 1 and further reference to FIG. 2, a biplanar gradient and RF coil assembly 40 is slidably received within the bore 12 as defined by the cosmetic sleeve 34. The planar RF and gradient coil assembly 40 includes a pair of dielectric guides 42 which conform to and are slidably received within the cosmetic sleeve 34. A biplanar gradient coil portion 44 includes a pair of y-gradient coils 46a, 46b mounted on planar dielectric formers which extend parallel to each other in an (x,y) plane (horizontal in FIG. 1). A pair of x-gradient coils 48a, 48b are mounted in parallel (y,z) planes on dielectric formers that extend vertically (in FIG. 1). The z-gradient coils extend annularly around the dielectric formers of the x and y-gradient coils, generally in (x,y) planes. Optionally, the z-gradient can be generated by the z-gradient coils of the circularly cylindrical gradient coil assembly 30. Suitable x, y, and z-gradient coils are described in U.S. Pat. No. 5,036,282.

Figure 3:
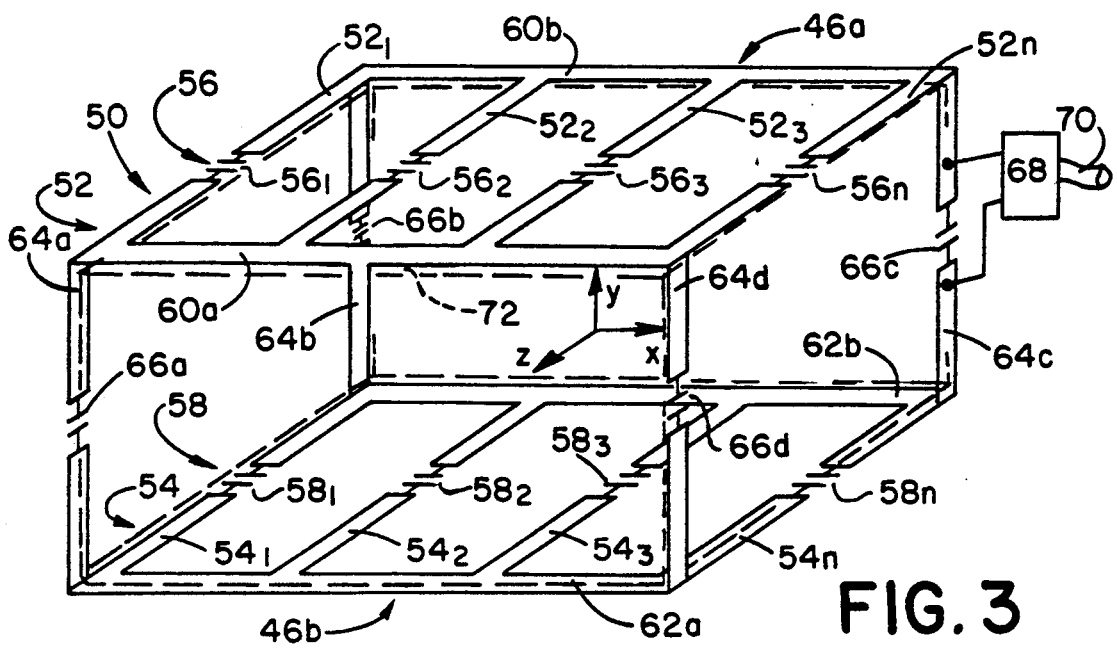
FIG. 3 is a perspective view of a biplanar RF coil assembly in accordance with the present invention with supporting dielectric material in phantom for simplicity of illustration.

With continuing reference to FIGS. 1 and 2 and further reference to FIG. 3, a first biplanar RF coil assembly 50 is provided inside the gradient coil assembly for generating and receiving RF fields in the y-direction. The first RF coil assembly includes a first conductor means 52, including a first plurality of conductors $52_1$, $52_2$, $52_3$, ..., $52_n$, causes a substantially uniform first current flow extending in the z-direction along an upper (x,z) planar surface. A second conductor means 54, including a second plurality of conductors $54_1$, $54_2$, $54_3$, ..., $54_n$, causes a substantially uniform second current flow extending along a second lower (x,z) plane parallel to the first upper plane. In the preferred embodiment, n equals 4. A first current adjusting means 56, including capacitors $56_1$, $56_2$, $56_3$, ... $56_n$, each mounted intermediately along a corresponding one of the first plurality of conductors, adjusts the current flow such that the current flow through each conductor at the selected radio frequency is equal. A second current adjusting means 58, including capacitors $58_1$, $58_2$, $58_3$, ..., $58_n$, each mounted intermediately along a corresponding one of the second plurality of conductors, adjusts the current flow such that the current flow through each conductor at the selected radio frequency is equal.

The top z-direction conductors are connected together by a pair of edge connectors 60a, 60b. The bottom conductors are likewise connected together by a pair of edge connectors 62a, 62b. Top and bottom portion connectors 64a, 64b, 64c, 64d interconnect the top and bottom edge connectors 60, 62. Capacitors 66a, 66b, 66c, 66d divide the connector strips 64a, 64b, 64c, 64d, respectively. The connectors 64 and capacitors 66 are selected such that the current flows through the first conductor means 52 is equal in magnitude and opposite in direction to the current through the second conductor means 54. A coupling circuit 68 interconnects the RF coil assembly 50 with an RF cable 70. In the preferred embodiment, the conductors 52, 54, 60, 62, and 64 are constructed of copper foil mounted on sheets of dielectric material 72.

Figure 4:
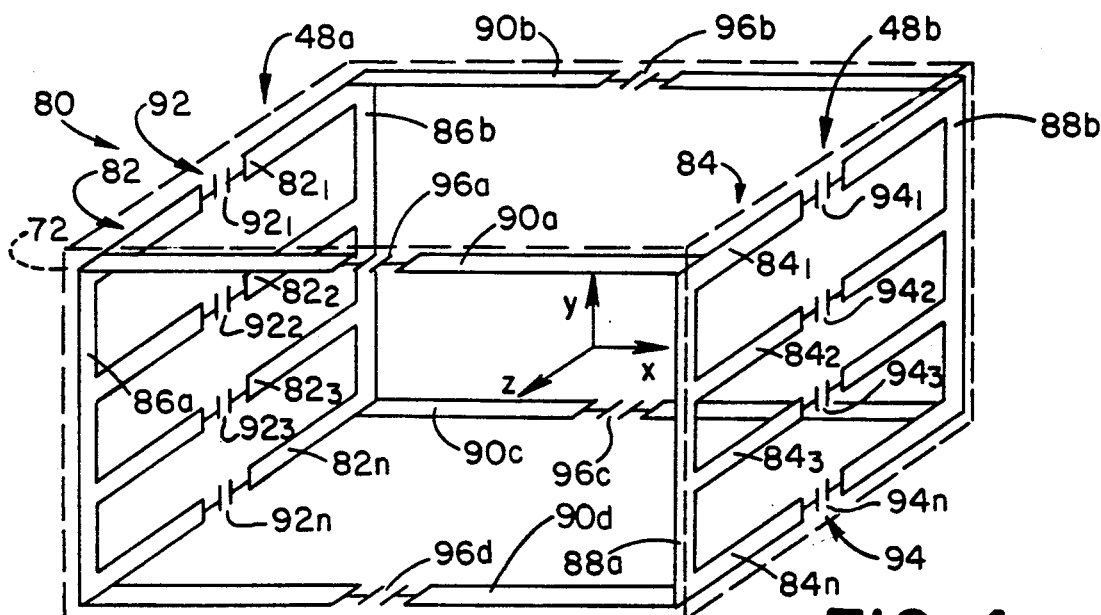
FIG. 4 is a diagrammatic illustration of a biplanar RF coil assembly in accordance with the present invention which is mounted to the same dielectric former (shown in phantom) as the biplanar coil of FIG. 2 to provide quadrature detection.

With continuing reference to FIGS. 1 and 2 and further reference to FIG. 4, a second RF coil 80 is provided for generating and receiving RF fields in the x-direction. The second RF coil 80 includes a first conductor means or set 82 of parallel electrical conductors extending parallel to each other and in the z-direction in a first (y,z) plane and a second conductor means or set 84 of conductors extending parallel to each other and in a z-direction in a second displayed (y,z) plane. First edge conductors 86a, 86b connect the ends of the first conductor set 82 and second edge conductors 88a, 88b connect the ends of the second conductor set 84. Conductors 90a, 90b, 90c, 90d interconnect the edge conductors 86a, 86b, and 88a, 88b. Capacitors 92 are mounted in the first conductors 82; capacitors 94 are connected in the second conductors 84; and capacitors 96a-96d are connected in conductors 90. The capacitors taken together are means that adjust the current flow through the third and fourth conductor sets such that at the selected RF frequency there is equal current flow through conductors 82 and equal current flow through conductors 84. The capacitors 96 are current adjusting means which are selected to insure that the current flow through conductors 82 and 84 is equal to each other, but in an opposite direction. The second RF coil assembly 80 is preferably constructed of copper foil mounted on opposite faces of the dielectric material 72 from the first RF coil assembly 50.

With reference to FIG. 1, if necessary, an RF shield coil 100 may be placed between the RF coils 50, 80 and the gradient coils 44. The RF shield coil 100 inhibits the RF current pulses applied to the RF coil assemblies from inducing gradient currents in the gradient coils.

As illustrated in FIG. 2, the top portion of the coil assembly 40 is preferably detachable. That is, appropriate connectors are provided in connectors 64, 86, and 88 of the RF coils to enable the top portion to be electrically coupled and decoupled. Similar electrical connectors are provided in the gradient coil assemblies and the shield coil assembly. In this manner, an upper portion 102 of the coil assembly 40 is physically removable and electrically detachable from a lower portion 104 of the coil assembly. This enables the patient to be positioned inside the coil assembly more easily.

Figure 5:
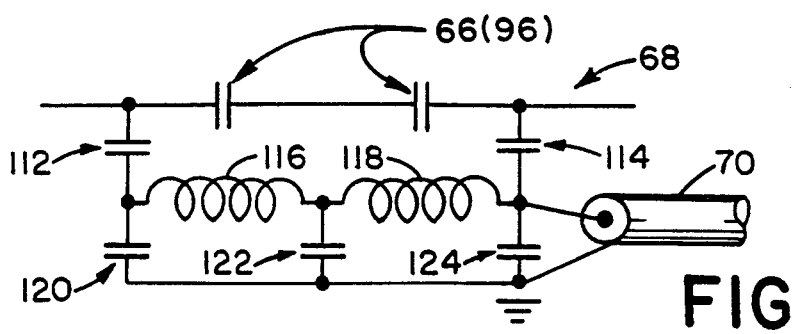
FIG. 5 illustrates a preferred coupling circuit for coupling the biplanar RF coil with an RF cable.

With reference to FIG. 5, the coupling circuit 68 connects the cable 70 with the RF coil assemblies while matching the impedance of the coil assembly to 50Ω when looking into the cable 70. The coupling circuit 68 also acts as a balun to couple the unbalanced cable to the balanced coil for better resonance stability. A pair of capacitors 112, 114 are connected across one of the capacitors 66 or 96. A pair of matched inductors 116, 118 are connected between the capacitors 112, 114. Three capacitors 120, 122, 124 are connected between each end of the coils and a ground sheath on the cable 70. The center or feed of the cable 70 is connected at the intersection of one of capacitors 112, 114 with the corresponding one of inductors 116, 118.

With reference again to FIG. 1, in operation, a gradient coil control means 130 controls an array of current amplifiers 132 to supply appropriate current pulses to one of gradient coils assemblies 44 and 30. More specifically, a switching means 134 selectively disconnects the current amplifiers 132 from the whole body gradient coils 30 when the insertable coil assembly 40 is inserted into the bore. A radio frequency transmitter 136 generates radio frequency signals which are conveyed by a switching means 138 to one of (1) the whole body radio frequency coils 32 and (2) the biplanar radio frequency coils 50, 80. The switching means 138 also connects a selected one of the radio frequency coils with a receiver 140. The receiver 140, preferably a digital receiver, demodulates the magnetic resonance signals emanating from the examination region and produces a series of digital views therefrom. An image reconstruction means 142 performs a two-dimensional inverse Fourier transform or other conventional image reconstruction technique to reconstruct the plurality of views into an image representation which is stored in an image memory 144. The image memory 144 is connected with a video monitor 146 which selectively displays man-readable images of the image representations in the memory 144.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging apparatus comprising:
    a main magnetic field means for generating a main magnetic field through an examination region;
    a magnetic field gradient means for generating magnetic field gradients across the examination region;
    a radio frequency coil mounted adjacent the examination region for selectively transmitting resonance frequency signals into and receiving resonance signals from the examination region, the radio frequency coil including:
       at least three first electrical conductors disposed along a first plane,
       at least three second electrical conductors disposed along a second plane, the second plane being parallel to the first plane and on the opposite side of the examination region therefrom,
       a current adjusting means for adjusting the relative current flows through the at least three first conductors and the at least three second conductors, the at least three first conductors each having substantially the same current flow therethrough and the at least three second conductors each having substantially the same current flow therethrough such that the first and second planes each have a substantially uniform current density at the resonance frequency, the first and second plane current densities being equal to each other and in opposite directions;
    a radio frequency transmitter for selectively transmitting resonance frequency signals to the radio frequency coil;
    a radio frequency receiver for receiving and demodulating resonance signals from the radio frequency coil;
    a reconstruction means for reconstructing an image representation from the received and demodulated resonance signals.

2. The apparatus as set forth in claim 1 wherein said current adjusting means includes a plurality of capacitors.

3. A magnetic resonance imaging apparatus comprising:

a main magnetic field means for generating a main magnetic field through an examination region;

a magnetic field gradient means for generating magnetic field gradients across the examination region;

a quadrature radio frequency coil mounted adjacent the examination region for selectively transmitting radio frequency signals into and receiving resonance signals from the examination region, the quadrature radio frequency coil including:

a first plurality of electrical conductors disposed along a first plane, a second plurality of electrical conductors disposed along a second plane, the second plane being parallel to the first plane and on the opposite side of the examination region therefrom;

a third plurality of conductors extending along a third plane, a fourth plurality of conductors extending along a fourth plane, the third and fourth planes being parallel to each other and substantially perpendicular to the first and second planes, the third and fourth planes being disposed on opposite sides of the examination region;

a radio frequency transmitter for selectively transmitting radio frequency signals to the radio frequency coil;

a radio frequency receiver for receiving and demodulating the resonance signals from the radio frequency coil;

a reconstruction means for reconstructing an image representation from the received and demodulated resonance signals.

4. The apparatus as set forth in claim 3 further including a current adjusting means for adjusting the relative current flows through the first, second third, and fourth plurality of conductors such that the first plurality of conductors each have a common first current flow therethrough, the second plurality of conductors each have a common second current flow therethrough, the first and second current flows being equal and opposite to each other, the third plurality of conductors each have a common third current flow therethrough and the fourth plurality of conductors each have a common fourth current flow therethrough, the third and fourth current flows being equal to each other and in opposite directions.

5. The apparatus as set forth in claim 3 wherein the main magnetic field means includes annular magnets which generate the main magnetic field such that the examination region is defined in a central bore thereof with the main magnetic field extending through a longitudinal axis of the central bore and wherein the first, second, third, and fourth plurality of conductors extend parallel to the longitudinal axis of the central bore.

6. A magnetic resonance imaging apparatus comprising:

a main magnetic field means for generating a main magnetic field through an examination region of sufficient cross section to receive a human subject's torso;

a magnetic field gradient means for generating magnetic field gradients across the examination region;

a quadrature radio frequency whole body coil mounted adjacent the examination region for selectively transmitting radio frequency signals into and receiving resonance signals from the examination region, the quadrature radio frequency whole body coil including:

at least three first electrical conductors disposed along a first plane, at least three second electrical conductors disposed along a second plane, the second plane being parallel to the first plane and on the opposite side of the examination region therefrom, at least three third electrical conductors disposed along a third plane, at least three fourth electrical conductors disposed along a fourth plane, the fourth plane being parallel to the third plane and on the opposite side of the examination region therefrom, a rectangularly cylindrical dielectric former on which the at least three first, at least three second, at least three third, and at least three fourth conductors are mounted;

a radio frequency transmitter for selectively transmitting quadrature radio frequency signals to the radio frequency coil;

a radio frequency receiver for receiving and demodulating in quadrature the resonance signals from the radio frequency coil;

a reconstruction means for reconstructing an image representation from the received and demodulated resonance signals.

7. A magnetic resonance apparatus comprising:

a main magnetic field means for generating a static, main magnetic field along a longitudinal axis of a central bore thereof, an examination region being defined in the central bore;

a magnetic field gradient means for generating magnetic field gradients across the main magnetic field in the examination region of the central bore;

a biplanar radio frequency coil disposed in the central bore for performing at least one of (i) transmitting radio frequency signals into the examination region, and (ii) receiving magnetic resonance signals from the examination region, the radio frequency coil including:

at least four first electrical conductor means disposed along a first planar region in a direction parallel to the longitudinal axis, a first means for selectively adjusting current through each of the first conductor means for causing a substantially uniform current flow along the first planar region, at least four second electrical conductor means disposed along a second planar region parallel to the longitudinal axis, a second means for selectively adjusting current through each of the second conductor means for causing a substantially uniform current flow along the second planar region, the first and second planar regions being substantially parallel to each other and on opposite sides of the examination region, the first and second current flows being in opposite directions parallel to the longitudinal axis;

a radio frequency transmitter means for selectively generating radio frequency signals for transmission into the examination region;

a radio frequency receiver means for selectively receiving and demodulating the resonance signals from the examination region; and, an image reconstruction means for reconstructing an image representation from the received, demodulated resonance signals.

8. A magnetic resonance apparatus comprising:

a main magnetic field means for generating a static, main magnetic field along a longitudinal axis of a central bore thereof;

a main magnetic field gradient means for generating magnetic field gradients across the main magnetic field in the central bore;

a biplanar radio frequency coil disposed in the central bore for performing at least one of (i) transmitting radio frequency signals into the examination region, and (ii) receiving magnetic resonance signals from the examination region, the radio frequency coil including:

a first electrical conductor means for defining a substantially uniform current flow along a first planar region in a direction parallel to the longitudinal axis, a second electrical conductor means for causing a second substantially uniform current flow along a second planar region parallel to the longitudinal axis, the first and second planar regions being substantially parallel to each other and on opposite sides of the examination region, a third conductor means for defining a substantially uniform current flow along a third planar region in a direction parallel to the longitudinal axis, a fourth conductor means for defining a substantially uniform current flow along a fourth planar region in a direction substantially parallel to the longitudinal axis, the third and fourth planar regions being parallel to each other an on opposite sides of the examination region;

a radio frequency transmitter means for selectively generating radio frequency signals for transmission into the examination region;

a radio frequency receiver means for selectively receiving and demodulating the resonance signals from the examination region; and, an image reconstruction means for reconstructing an image representation from the received, demodulated resonance signals.

9. The apparatus as set forth in claim 8 wherein the radio frequency coil assembly is selectively insertable into and withdrawable from the bore.

10. The apparatus as set forth in claim 9 wherein the gradient coil means includes gradient coil assemblies which are mounted on planar dielectric surfaces which extend substantially parallel to the first, second, third, and fourth planes, which gradient coil means is selectively insertable into and removable from the bore with the radio frequency coil.

11. The apparatus as set forth in claim 8 further including current adjusting means for adjusting the uniformity of the current flows in the first, second, third, and fourth conductor means.

12. A magnetic resonance imaging apparatus comprising:

an array of annular superconducting magnets for generating a substantially uniform, static magnetic field through a central bore thereof;

a whole body gradient magnetic field coil assembly mounted around the central bore on a cylindrical dielectric former for selectively generating gradient magnetic fields in the bore;

a whole body radio frequency coil mounted adjacent the whole body gradient magnetic field coil assembly for selectively generating radio frequency signals in and receiving radio frequency signals from the bore;

an insertable biplanar radio frequency coil assembly including:

a first planar coil section disposed along a first plane, the first planar coil section including at least four first electrically conductive strips extending parallel to each other along the first plane;

a first pair of edge connectors for electrically connecting opposite ends of the first conductors;

a second planar coil section disposed along a second plane, the second planar coil section including at least four second electrically conductive strips extending parallel to each other along the second plane and parallel to the first conductors, the first and second planes being disposed on opposite sides of an examination region;

a second pair of edge connectors for electrically connecting opposite ends of the second conductors;

electrical connecting means for electrically connecting the first and second pairs of edge connectors such that current flows along the first planar coil section in a first direction parallel to a longitudinal axis of the bore and along the second planar coil section in a second direction opposite to the first direction parallel to the longitudinal axis of the bore;

a means for adjusting the current through the first and second conductors such that at a selected radio frequency, the current flows through the first and second conductors are equal and such that the current flows through the first conductors in an opposite direction than the current flows through the second conductors;

a radio frequency transmitter which is selectively connectable with the whole body radio frequency coil and the insertable, biplanar radio frequency coil assembly;

a radio frequency receiver means which is selectively connectable with the whole body radio frequency coil and the insertable biplanar radio frequency coil assembly for receiving and demodulating radio frequency magnetic resonance signals therefrom; and, a reconstruction means for reconstructing an image representation from the received, demodulated magnetic resonance signals.

13. A biplanar radio frequency coil for magnetic resonance apparatus, the biplanar radio frequency coil comprising:

at least four first electrically conductive strips extending parallel to each other along a first plane;

at least four second electrically conductive strips extending parallel to each other along a second plane and parallel to the first conductors, the first and second planes being parallel to each other;

a first pair of edge connections for electrically connecting opposite ends of the first conductors;

a second pair of edge connectors for electrically connecting opposite ends of the second conductors;

electrical connecting means for electrically connecting the first and second pairs of edge connectors;

a current controlling means for controlling the current through the first and second conductive strips such that at a selected resonance frequency, the current flows through the first and second conductive strips with equal magnitude and the current flows through the first conductive strips in an opposite direction than the current flows through the second conductive strips.

14. The biplanar coil assembly as set forth in claim 13 wherein the electrical connecting means for connecting the first pair of edge connectors with the second pair of edge connectors include capacitors connected electrically in series therewith.

15. The biplanar coil assembly as set forth in claim 13 further including:
   at least four third electrically conductive strips extending parallel to each other along a third plane;
   at least four fourth electrically conductive strips extending parallel to each other along a fourth plane and parallel to the third conductive strips, the third and fourth planes being parallel to each other;
   a third pair of edge connectors for electrically connecting opposite ends of the third conductive strips;
   a fourth pair of edge connectors for electrically connecting opposite ends of the fourth conductive strips;
   a means for electrically connecting the third and fourth pairs of edge connectors;
   a means for adjusting the current through the third and fourth conductive strips such that at the selected resonance frequency, the current flows through the third and fourth conductive strips with equal magnitude and in an opposite direction, the third and fourth planes being substantially perpendicular to the first and second planes, whereby the biplanar coil assembly is a quadrature coil assembly.

16. A biplanar coil assembly for a magnetic resonance apparatus, the biplanar coil assembly comprising:
   at least three first electrical conductors extending parallel to each other along a first plane;
   at least three second electrical conductors extending parallel to each other along a second plane and parallel to the first conductors, the first and second planes being parallel to each other;
   a first pair of edge connectors for electrically connecting opposite ends of the first conductors;
   a second pair of edge connectors for electrically connecting opposite ends of the second conductors;
   electrical connecting means for electrically connecting the first and second pairs of edge connectors;
   at least one capacitor connected electrically in series with each of the first conductors between the first pair of edge connectors and a capacitor connected electrically in series with each of the second conductors between the second pair of edge connections, such that at a resonance radio frequency, the current flows through each of the first and second conductors with equal magnitude and the current flows through the first conductors in an opposite direction than the current flows through the second conductors.

* * * * *